United States Patent
Clark et al.

(10) Patent No.: US 11,005,231 B2
(45) Date of Patent: May 11, 2021

(54) STRAIN-BALANCED SEMICONDUCTOR STRUCTURE

(71) Applicant: IQE plc, Cardiff (GB)

(72) Inventors: Andrew Clark, Mountain View, CA (US); Rodney Pelzel, Emmaus, PA (US); Andrew Johnson, Caldicot (GB); Andrew Martin Joel, Cardiff (GB); Aidan John Daly, Cardiff (GB); Adam Christopher Jandl, Needham, MA (US)

(73) Assignee: IQE plc, St. Mellons (GB)

( * ) Notice: Subject to any disclaimer, the term of this patent is extended or adjusted under 35 U.S.C. 154(b) by 0 days.

(21) Appl. No.: 16/198,391

(22) Filed: Nov. 21, 2018

(65) Prior Publication Data

US 2019/0157834 A1 May 23, 2019

Related U.S. Application Data

(60) Provisional application No. 62/589,994, filed on Nov. 22, 2017, provisional application No. 62/607,857, filed on Dec. 19, 2017.

(51) Int. Cl.
*H01S 5/02* (2006.01)
*H01S 5/183* (2006.01)
(Continued)

(52) U.S. Cl.
CPC ...... *H01S 5/0218* (2013.01); *H01L 21/02381* (2013.01); *H01L 21/02546* (2013.01);
(Continued)

(58) Field of Classification Search
CPC ............. H01S 5/0218; H01L 21/02381; H01L 21/02538–02549
See application file for complete search history.

(56) References Cited

U.S. PATENT DOCUMENTS 4,963,949 A * 10/1990 Wanlass ............ H01L 21/02381
136/252
5,548,128 A 8/1996 Soref et al.
(Continued)

FOREIGN PATENT DOCUMENTS

WO WO2019/052672 3/2019

OTHER PUBLICATIONS

D'Hondt M. et al., "High quality InGaAs/AlGaAs lasers grown on Ge substrates", *Journal of Crystal Growth*, vol. 195, pp. 655-659 (1998).

(Continued)

*Primary Examiner* — Tod T Van Roy
*Assistant Examiner* — Sean P Hagan
(74) *Attorney, Agent, or Firm* — Sterne, Kessler, Goldstein & Fox P.L.L.C.

(57) ABSTRACT

Systems and methods are described herein to grow a layered structure. The layered structure comprises a first germanium substrate layer having a first lattice constant, a second layer that has a second lattice constant and is epitaxially grown over the first germanium substrate layer, wherein the second layer has a composite of a first constituent and a second constituent, and has a first ratio between the first constituent and the second constituent, and a third layer that has a third lattice constant and is epitaxially grown over the second layer, wherein the third layer has a composite of a third constituent and a fourth constituent, and has a second ratio between the third constituent and the fourth constituent, wherein the first ratio and the second ratio are selected such that the first lattice constant is between the second lattice constant and the third lattice constant.

20 Claims, 6 Drawing Sheets

(51) Int. Cl.
    *H01S 5/323*    (2006.01)
    *H01S 5/026*    (2006.01)
    *H01L 21/02*    (2006.01)

(52) U.S. Cl.
    CPC .............. *H01S 5/026* (2013.01); *H01S 5/183* (2013.01); *H01S 5/32308* (2013.01); *H01S 2304/02* (2013.01); *H01S 2304/04* (2013.01)

(56) References Cited

U.S. PATENT DOCUMENTS

| | | | | |
|---|---|---|---|---|
| 2002/0076906 A1* | 6/2002 | Hilt | ................... | H01L 21/02428 438/517 |
| 2005/0199883 A1* | 9/2005 | Borghs | .............. | H01L 21/02381 257/78 |
| 2006/0166468 A1* | 7/2006 | Yonehara | ................. | C30B 25/02 438/483 |
| 2009/0057648 A1* | 3/2009 | Hudait | .............. | H01L 21/02381 257/14 |
| 2010/0237387 A1* | 9/2010 | Sato | ................... | H01L 21/02381 257/190 |
| 2011/0272665 A1* | 11/2011 | Yamaguchi | ....... | H01L 21/02381 257/12 |
| 2012/0125418 A1* | 5/2012 | Puetz | ................ | H01L 21/02433 136/255 |
| 2014/0252366 A1* | 9/2014 | Gao | .................... | H01L 29/2003 257/76 |
| 2017/0229549 A1* | 8/2017 | Derluyn | ............ | H01L 21/02505 |

OTHER PUBLICATIONS

C. Richardson et al., "Metamorphic epitaxial materials," Material Research Society Bulletin, vol. 41, pp. 193-198 (2016).

\* cited by examiner

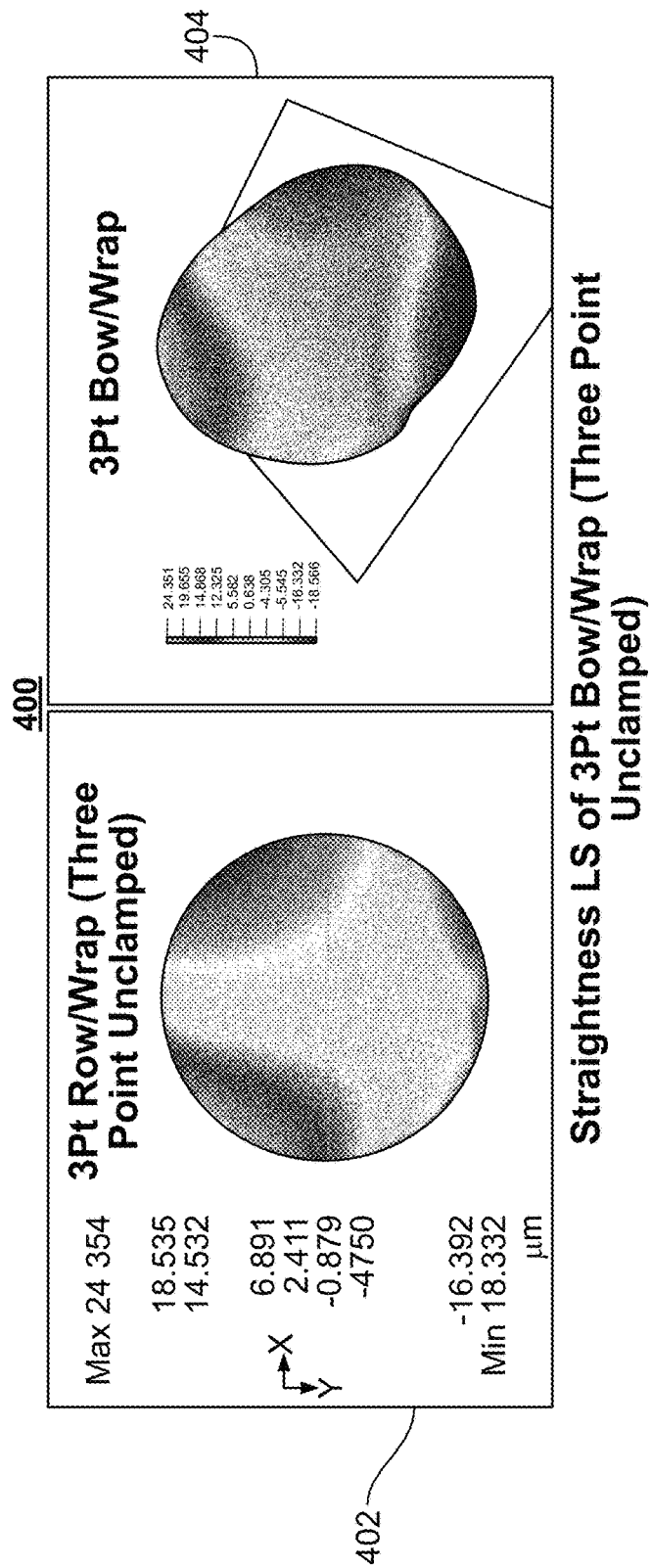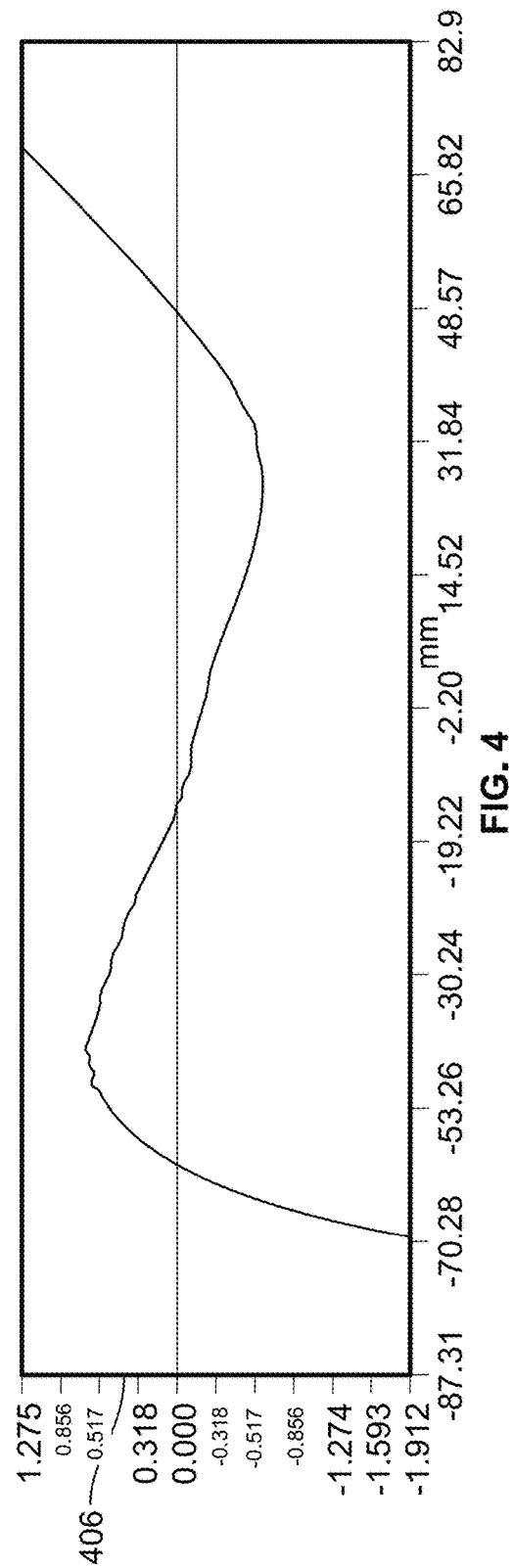
FIG. 4

STRAIN-BALANCED SEMICONDUCTOR STRUCTURE

CROSS-REFERENCE TO RELATED APPLICATION

This application claims the benefit under 35 U.S.C. § 119(e) of U.S. Provisional Patent Application No. 62/589,994, filed Nov. 22, 2017, and U.S. Provisional Patent Application No. 62/607,857, filed Dec. 19, 2017, both of which are hereby incorporated by reference herein in their entirety.

FIELD OF USE

This application relates to the use of a germanium (Ge) substrate or epitaxial layer to strain balance a semiconductor structure.

BACKGROUND

A vertical-cavity surface-emitting laser (VCSEL) is a type of semiconductor laser diode with laser beam emission perpendicular from the top surface of the semiconductor structure. VCSELs for wavelengths from 650 nm to 1300 nm are typically grown on gallium arsenide (GaAs) substrates with a distributed Bragg reflector (DBR) formed from GaAs and aluminum gallium arsenide ($Al_xGa_{(1-x)}As$). This GaAs—AlGaAs system has been widely used because $Al_xGa_{1-x}As$ (for a broad range of x) is usually regarded as a lattice match to the GaAs substrate. Next generation VCSELs, with more complex designs, would lead to thicker epi stacks for which the assumed lattice match in the GaAs—AlGaAs system is no longer acceptable, due to higher levels of crystalline defects, and increased wafer bow caused by the increased thickness of the stacks. This situation is compounded by designs incorporating GaAs and AlAs, because the product of lattice mismatch and thickness is increased in a thick stack while the desire to move to longer wavelengths would increase layer thicknesses. The increase in thickness may create an increased total product of lattice mismatch and thickness between the substrate and other layers grown over the substrate, leading to increased stress in the semiconductor structure. The strain and the lattice mismatch contribute to a bow in the semiconductor wafer that reduces the stability of the VCSEL.

SUMMARY

A layered structure is described herein for the use of germanium (Ge) as substrate or epitaxial layer to strain balance a semiconductor structure. The layered structure comprises a first germanium substrate layer having a first lattice constant, and a second layer that has a second lattice constant and is epitaxially grown over the first germanium substrate layer. The second layer has a composite of a first constituent and a second constituent and has a first ratio between the first constituent and the second constituent. A third layer that has a third lattice constant and is epitaxially grown over the second layer. The third layer has a composite of a third constituent and a fourth constituent, and has a second ratio between the third constituent and the fourth constituent. The first ratio and the second ratio are selected such that the first lattice constant is between the second lattice constant and the third lattice constant.

In some embodiments, the first constituent of the second layer is the same as the third constituent of the third layer, and the second constituent of the second layer is the same as the fourth constituent of the third layer. In some embodiments, the first constituent is different from the third constituent.

In some embodiments, the first, the second, the third or the fourth constituent of the third layered structure is a III-V binary alloy selected from a group consisting of AlP, GaP, InP, AlAs, GaAs, InAs, AlSb, GaSb, and InSb.

In some embodiments, the second layer of the layered structure has a first thickness and the third layer has a third thickness, and wherein the first thickness and the third thickness are chosen such that a total strain in the layered structured that is defined at least in part by the first thickness, the second thickness and lattice constant differences between adjacent layers is close to zero. In some embodiments, a repetition of the second layer and the third layer grown over the third layer.

In some embodiments, the layered structure is implemented as a vertically-cavity surface-emitting laser (VCSEL) epitaxial wafer. In some embodiments, the VCSEL epitaxial wafer has a bow measurement less than 10 μm. In some embodiments, the first germanium substrate layer of the layered structure is a single germanium wafer, and a lattice constant of an upper surface of the single germanium wafer is equivalent to a bulk germanium substrate. In some embodiments, the first germanium substrate layer of the layered structure includes a germanium wafer on an oxide layer that is on a silicon layer. A lattice constant of an upper surface of the germanium wafer is equivalent to a bulk germanium substrate.

In some embodiments, the first germanium substrate layer includes a germanium wafer on a silicon layer, and a lattice constant of an upper surface of the germanium wafer is equivalent to a bulk germanium substrate. In some embodiments, the first germanium substrate layer includes one or more porous germanium layers within a bulk germanium wafer, and a lattice constant of the upper surface of the bulk germanium wafer that is adjacent to the second layer is equivalent to the lattice constant a bulk germanium substrate (without porous portion).

In some embodiments, the first germanium substrate layer includes a patterned germanium wafer having a first germanium portion and a second germanium portion that is spatially non-overlapping from the first germanium portion, and a lattice constant of an upper surface of the first region or the second region in the patterned germanium wafer is equivalent to a bulk germanium substrate.

In some embodiments, the first germanium substrate layer of the layered structure includes a layered structure of a germanium tin ($Ge_xSn_{1-x}$, $0 \leq x \leq 1$) wafer that is grown over a germanium wafer. In some embodiments an epitaxial germanium layer grown over the first germanium substrate layer, wherein the epitaxial germanium layer is used to host an embedded device, and wherein the embedded device is selected from a group consisted of a germanium APD, a GaAs PIN and a Germanium transistor. In some embodiments, the layered structure further comprises a second germanium layer, having the first lattice constant, that is directly or indirectly above the third layer, and a fourth layer having the first constituent and the second constituent epitaxially grown over the second germanium layer, wherein a third ratio between the first constituent and the second constituent in the fourth layer is chosen to render a third lattice constant of the fourth layer that is used to offset a total strain from layers below the second germanium layer.

BRIEF DESCRIPTION OF DRAWINGS

Further features of the disclosure, its nature and various advantages will be apparent upon consideration of the following detailed description, taken in conjunction with the accompanying drawings, in which:

FIG. 4 is a depiction of a plot indication wafer bow, according to an illustrative embodiment;

DETAILED DESCRIPTION

Structures and methods described herein provide a strain balanced semiconductor structure. For example, the semiconductor structure described herein may be applied to VCSELs. The structures and methods disclosed herein include growing GaAsAl layers over germanium substrates.

Figure 1:
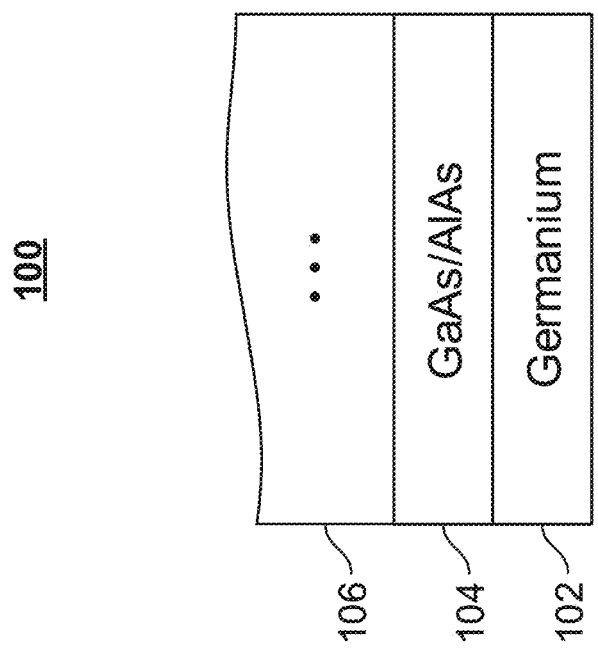
FIG. 1 depicts a layered structure to grow strain balanced vertical cavity surface-emitting laser on a germanium substrate, according to an illustrative embodiment.

FIG. 1 shows an example diagram illustrating a layered structure 100 according to an illustrative embodiment. The layer structure 100 depicted in FIG. 1 may be manufactured in a single epitaxial process, either molecular beam epitaxy (MBE), metalorganic vapor phase epitaxy (MOCVD) or any of the other well-known epitaxial deposition techniques. As required by the process, a deposition tool to deposit the material may either be single chamber or use any of the well-known cluster tool formats where specific parts of the process are done in different interconnected chambers, or multiple deposition tools may be used. For example, the additional layers 106 may include, but not limited to group IV layers, III-V semiconductors layers, rare earth pnictide layers, rare earth oxide layers, and/or the like.

The layered structure 100 of FIG. 1 includes a germanium substrate 102, a GaAs/AlAs layer 104 grown over the substrate 102, and additional layers 106 grown over the GaAs/AlAs layer 104. In some embodiments, layer 104 may comprise multiple sublayers of GaAs and AlAs. In some embodiments, an increase in the concentration of aluminum in layer 104 (e.g., in a VCSEL) may lead to a lattice mismatch if the traditional GaAs substrate is used to grow the layer 104—for example, in a VSCEL, the layer 104 may have a thickness of three micrometer (3 μm) or more, and the lattice mismatch that exists between the AlAs sublayer of the 104 layer and the traditional GaAs substrate can have a significant effect when the mismatch is summed over multiple sublayers of the total thickness of layer 104. In addition, as any layer grown on the GaAs substrate may have some degree of lattice mismatch, when the product of lattice mismatch and thickness increases because of the composition of the layer grown on GaAs, or when multiple repetitions of GaAs-layer pairs are used within the semiconductor structure, the product of lattice mismatch and thickness may be significant. The stress acting on the substrate caused by the product of lattice mismatch and thickness may lead to a bow in the structure 200, e.g., the center point of the median surface of an un-clamped wafer corresponding to the structure 100 may deviate from the median surface to a reference plane. The resulting bow may have a radius of curvature that increases with the size of the wafer, e.g., the larger the wafer is, the more significant the radius of curvature corresponding to the bow becomes. For example, the radius of curvature corresponding to the bow in a 200-mm wafer would be greater than the radius of curvature corresponding to the bow in a 100-mm wafer. The bow may limit the scalability of GaAs-based laser structures. Thus, to avoid or reduce the bow that is incurred by the stress caused by the product of lattice mismatch and thickness due to the use of a GaAs substrate, a substrate of germanium 102 is used in the layered structure 100 to grow the GaAs/AlAs layer 104 with a high concentration of Al. The lattice constant of a germanium layer is comparable to the lattice constant of GaAs/AlAs layers, for example, the lattice constant of a germanium wafer is usually between that of a GaAs layer and an AlAs layer. Thus, the germanium layer may be used to reduce the stress caused by the product of lattice mismatch and thickness caused by growing GaAs/AlAs layers in layered structure 100. As the Young's modulus of germanium is $90 \times 10^9$ Pa (greater than that of GaAs, e.g., $85 \times 10^9$ Pa), germanium yields better mechanical strength than GaAs, and thus may provide a stronger substrate (102) than a traditional GaAs substrate for a 200-mm wafer when the bow may affect a significant area on the wafer. Additionally, germanium has a much lower etch-pitch density than the GaAs, which produces a wafer with reduced impurities, although wafers may be supplied with inherent defects.

In some embodiments, the layered structure 100 may include one or more intermediary layers between the germanium substrate 102 and the GaAs/AlAs layer 104. In some examples, the intermediary layer may be a generic III-V layer.

Figure 2:
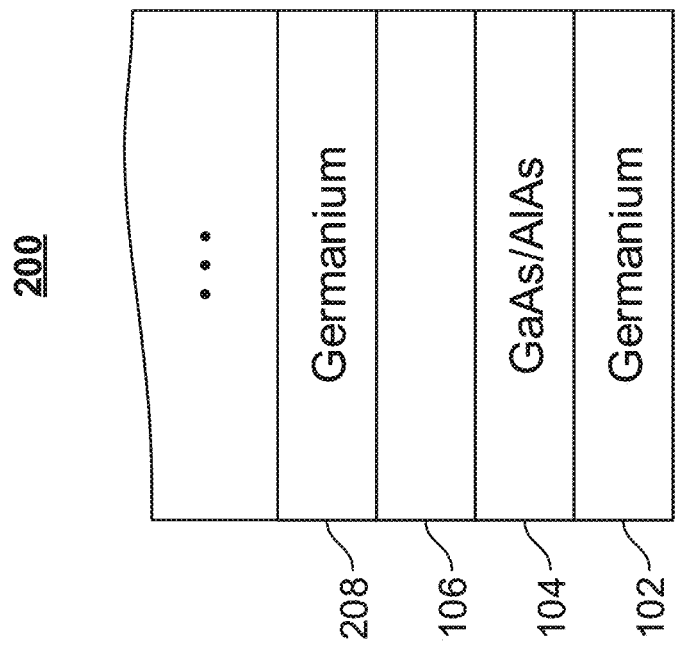
FIG. 2 depicts a layered structure to grow strain balanced vertical cavity surface-emitting laser on a germanium substrate that includes an intermediate germanium layer, according to an illustrative embodiment.

FIG. 2 shows an example diagram illustrating a layered structure 200 according to an illustrative embodiment. The layered structure 200 may be built upon the layered structure 100. For example, a second germanium layer 208 may be epitaxially grown on top of the additional layer(s) 106, such that another layer stack of GaAs/AlAs can be grown over the second germanium layer 208.

In some embodiments, the second germanium layer 208 (or multiple germanium layers) is grown in the layered structure 200. In some embodiments, the layer 208 may also be a group IV alloy of the form $Ge_{1-x-y}Si_xSn_y$ ($0 \leq x, y \leq 1$)—which is equivalent to a germanium layer when x=y=0. The intermediate germanium layer improves the lattice match for high concentration of aluminum in the layer 104. This reduces the strain between the substrate layer 102 and the layer 104. The reduction in strain in between the layers 102 and 104 increases the stability of the layer 200. It is noted that the two germanium layers 102 and 208 are shown in FIG. 2 for illustrative purposes only. Multiple (more than two) germanium layers may be used in the layered structure such that multiple repetition of a germanium layer and a GaAs/AlAs layer grown over the germanium layer can be employed in a single layered structure to increase the stability of the structure 200.

In some embodiments, the thickness of the germanium layer 102 and 208 may be different. The thickness of the second germanium layer 208 may depend on the lattice mismatch introduced by the various layers below the second germanium layer 208 or layers above the second germanium layer 208. In some embodiments, more than one intermediary germanium layer may be grown in the lattice structure 200 to induce a stability in the lattice structure 200.

Figure 3:
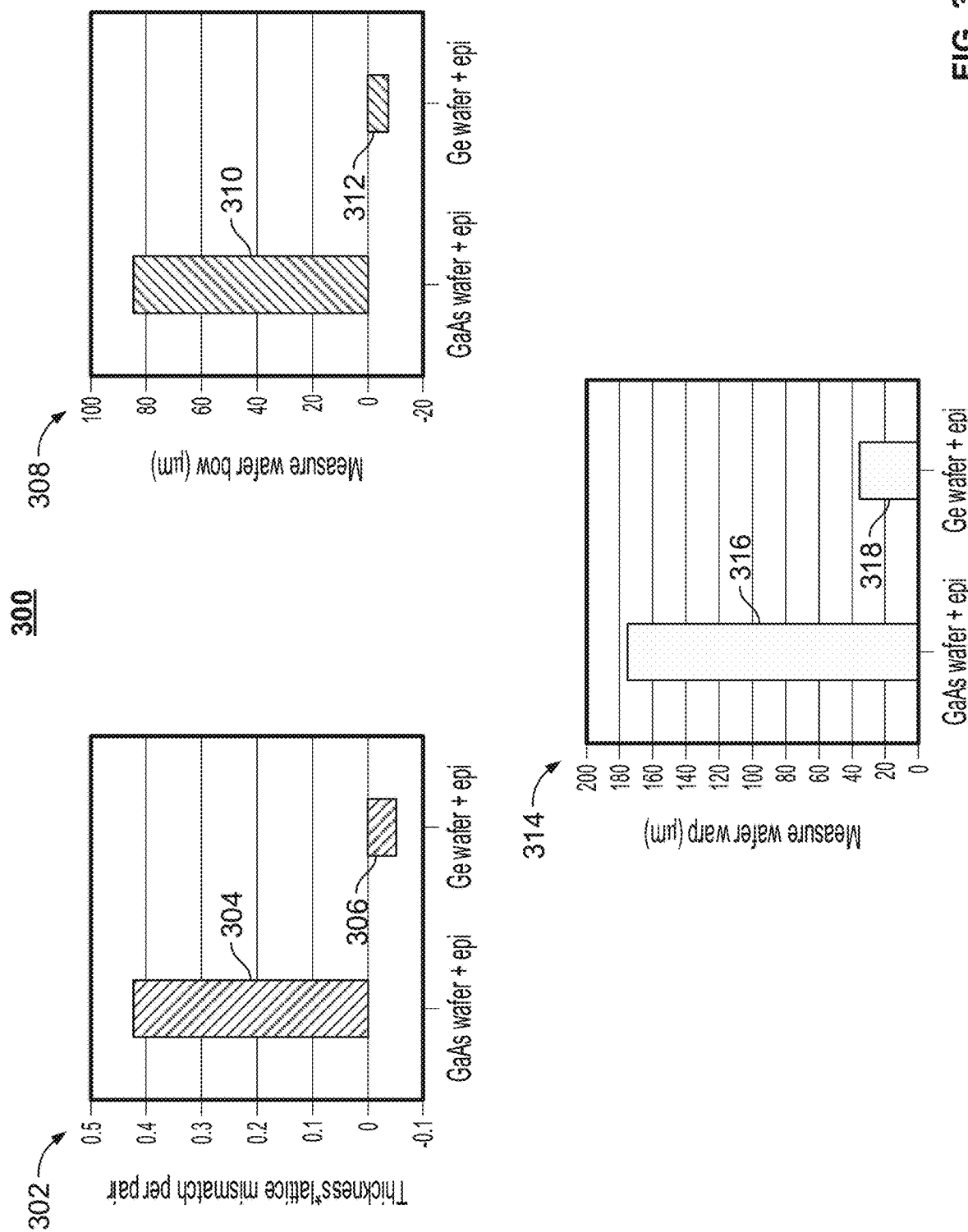
FIG. 3 provides an example diagram 300 showing data plot diagrams comparing lattice mismatch, wafer bow, and wafer warp between different types of substrates, respectively, according to an embodiment.

FIG. 3 provides an example diagram 300 showing data plot diagrams 302, 308 and 314 comparing lattice mismatch, wafer bow, and wafer warp between different types of substrates, respectively, according to an embodiment. Data plot 302 uses the product of thickness and lattice mismatch as a performance metric to compare performances between a GaAs wafer and a Ge wafer. Bar 304 represents the product of thickness and lattice mismatch of a layered structure of a GaAs wafer and an epitaxial film over the GaAs wafer. Bar 306 represents the product of thickness and lattice mismatch of a layered structure having a Ge wafer and an epitaxial film over the Ge wafer (similar to 100 in FIG. 1). As depicted in FIG. 3, the product of thickness of and lattice mismatch for using a GaAs wafer is approximately 0.4, and is reduced to −0.05, when a Ge wafer is used instead, as shown at bar 306.

Data plot 308 uses the measurement of wafer bow as a performance metric to compare performances between a GaAs wafer and a Ge wafer. Bar 310 represents the measurement of bow created in a layered structure of a GaAs wafer and an epitaxial film over the GaAs wafer. Bar 312 represents the measurement of bow created in a layered structure having a Ge wafer and an epitaxial film over the Ge wafer (similar to 100 in FIG. 1). As depicted in FIG. 3, the bow created using a GaAs wafer as a substrate is approximately 90 μm and is reduced to −5 μm, when a Ge wafer is used instead, as shown at bar 312.

Data plot 314 uses the measurement of wafer warp as a performance metric to compare performances between a GaAs wafer and a Ge wafer. Bar 316 represents the measurement of warp created in a layered structure of a GaAs wafer and an epitaxial film over the GaAs wafer. Bar 318 represents the measurement of warp created in a layered structure having a Ge wafer and an epitaxial film over the Ge wafer (similar to 100 in FIG. 1). As depicted in FIG. 3, the warp created using a GaAs wafer as a substrate is approximately 180 μm and is reduced to 40 μm, when a Ge wafer is used instead, as shown at bar 318.

The marked decrease in measurement of the product of thickness and lattice mismatch, wafer bow, and wafer warp is because the germanium substrate has a lattice constant between that of GaAs and AlAs, and hence the stress exerted on the Ge layer by the GaAs layer is in an opposite direction to that exerted by the AlAs on the Ge layer and hence the opposite stresses may mutually cancel out to some extent. In the case where the substrate is GaAs, the GaAs/AlAs layers exert a stress of the epitaxial film in the same direction because the GaAs substrate has the smallest or same lattice constant as the material above the GaAs substrate.

FIG. 4 shows a plot of three-dimensional maps of layered structures using a Ge substrate or a GaAs substrate, respectively, according to an illustrative embodiment. 3-D map 402 is a map of in a layered structure having a Ge wafer and an epitaxial film over the Ge wafer (similar to 100 in FIG. 1). 3-D map 404 of a layered structure of a GaAs wafer and an epitaxial film over the GaAs wafer. As is clear from the 3-D map 404, the high level of bow created by the GaAs wafer and epitaxial films exceeded maximum allowable bow to achieve a full wafer map. FIG. 4 includes a plot 406 that measures wafer bow for layered structure cases where that contains an epitaxial film composed of 10% AlGaAs and 90% AlGaAs over the GaAs and Ge substrates. As is clear from the plot, bow created on the GaAs wafer by the epitaxial films is much higher than the bow created on the Ge substrate by the epitaxial film. The reduction in bow of the Ge wafer increases performance of the layered structure with the Ge wafer.

Figure 5:
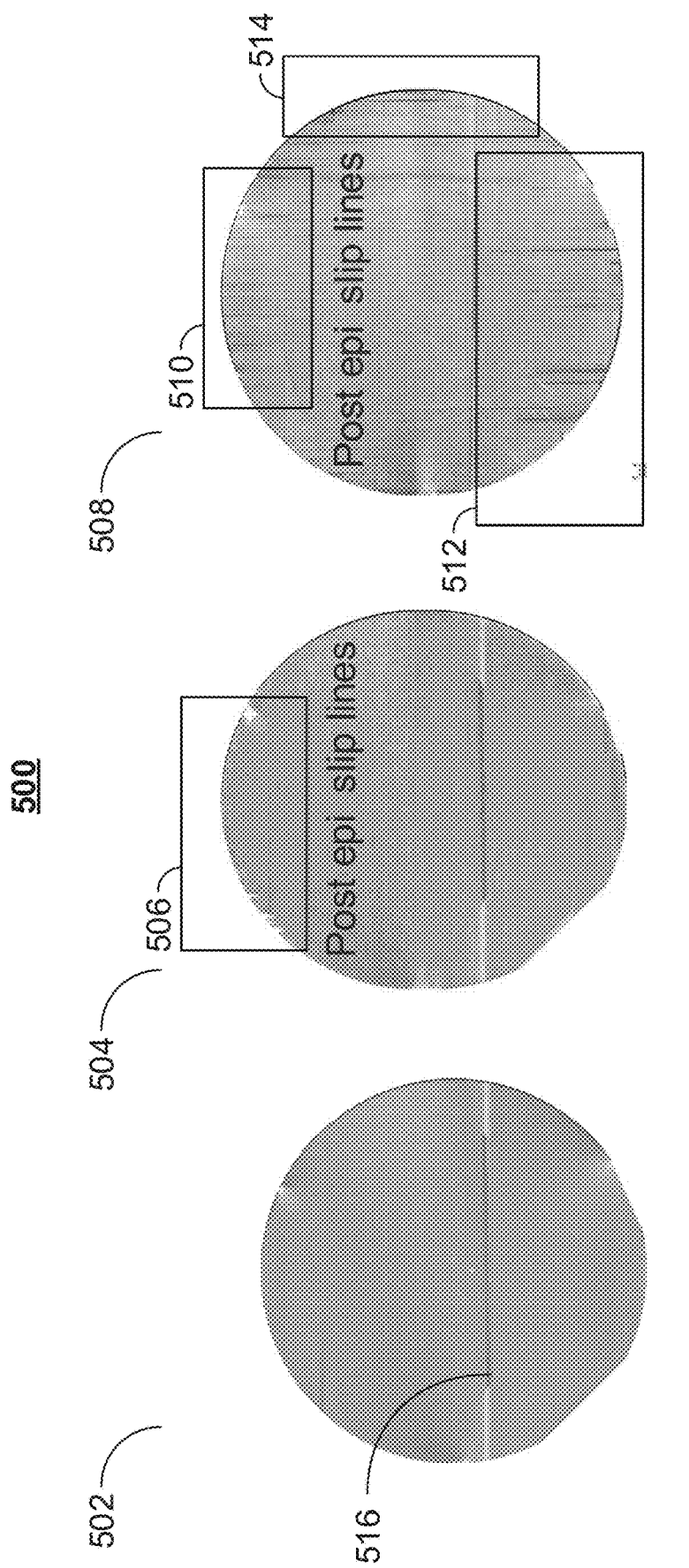
FIG. 5 is a depiction of lattice dislocation of various layered structures, according to an illustrative embodiment.

FIG. 5 shows diagram 500 illustrating lattice dislocation in various layered structures shown at 502, 504 and 508, according to an illustrative embodiment. Lattice dislocation is represented by slip lines on wafer. Slip lines are internal to the wafer and are a leading cause of device reliability failures. In some embodiments, the mechanical forces inherent to wafers with large values of bow create and drive dislocations within a layered structure that increases slip lines on the substrate of the layered structure. Therefore, a reduction in wafer bow would reduce or eliminate these slip lines on the substrate of the layered structure. Plot 502 represents a snapshot of a Ge wafer. The snapshot of Ge wafer includes a horizontal line 516 running across the wafer that is a measurement artifact. Plot 504 represents a snapshot of a Ge wafer and an epitaxial film over the Ge wafer. Plot 504 depicts slip line regions created in the Ge wafer 506 by the strain caused by the epitaxial film on the Ge wafer. Plot 508 represents a snapshot of a GaAs wafer and an epitaxial film over the GaAs wafer. Plot 508 shows slip line regions 510, 512, and 514 created in the GaAs wafer by the epitaxial film grown over the GaAs wafer. As is clear from the snapshots, there are more slip lines in the GaAs wafer than in the Ge wafer. This is because the stress created on the Ge wafer by the epitaxial film is much lower than the stress created by the epitaxial film on the GaAs wafer.

Figure 6:
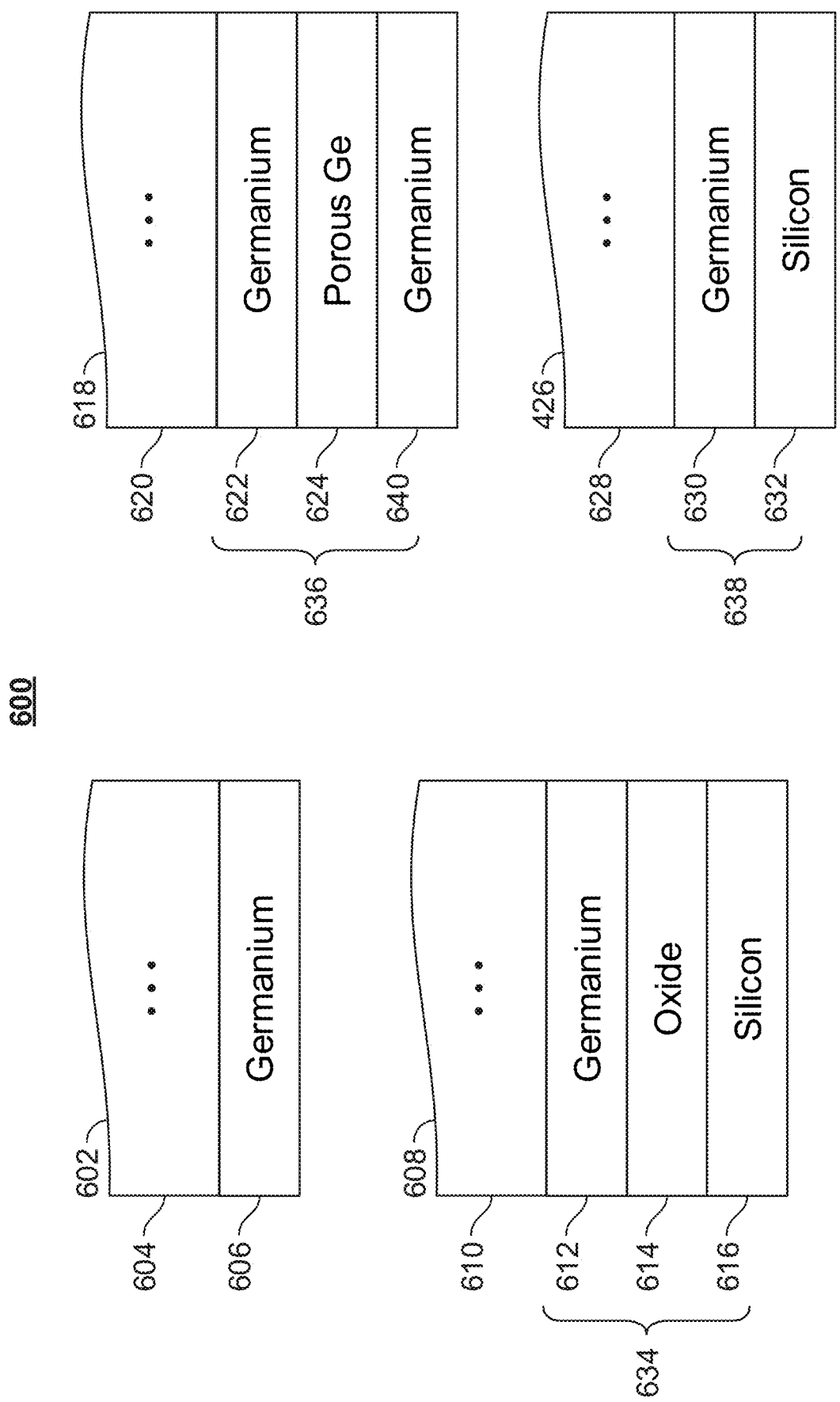
FIG. 6 is a depiction of various example substrate structures for the germanium substrate 102 described in relation to FIGS. 1-2, according to an illustrative embodiment.

FIG. 6 is a depiction of various example substrate structures for the germanium substrate 102 described in relation to FIGS. 1-2, according to an illustrative embodiment. For example, the germanium substrate (e.g., see 102 in FIGS. 1-2) may include a single wafer, or a layered structure. The various substrate structures described in FIG. 6 may have different compositions that include various portions of germanium in them. For example, the various substrates may be a germanium wafer (e.g., see 602), a layered structure of germanium grown over oxide and silicon (e.g., see 608), a layered structure of a germanium layer containing a porous germanium portion (e.g., see 618), or a layered structure of germanium grown over a silicon layer (e.g., see 626), and/or the like. The example substrate structures 602, 608, 618 and 626 as described in FIG. 6 may serve as a starting template to grown additional layers, and the upper surface of the example substrate structures 602, 608, 618 and 626 has a lattice constant equivalent to that of a bulk germanium substrate. The various substrate structures may differ in various properties like mechanical strength, thermal conductivity, and etch pitch density, for example, which in turn support different functionalities based on the combination of the substrates.

Layered structure 602 depicts a germanium wafer 606 over which other layers 604 may be grown. The upper surface of the germanium wafer 606 has a lattice constant that is substantially equivalent to a bulk germanium substrate.

Layered structure 608 depicts a substrate structure 634 that includes a germanium layer 612, an oxide layer 614 and a silicon layer 616. The germanium layer 612 is grown over an oxide layer 614, and the oxide layer 614 is grown over a silicon layer 616. In another implementation, the growth of germanium layer 612 over oxide layer 614 may be the result of a bonding process. Other layers 610 part of layered structure 608 may be grown over the germanium layer 610. The upper surface of the germanium wafer 612 has a lattice constant that is substantially equivalent to a bulk germanium substrate.

Layered structure 618 depicts a substrate structure 636 that includes a porous germanium portion/sublayer 624. The substrate structure 636 can be a bulk germanium wafer having the porous sublayer 624—positioned between germanium sublayers 622 and 640. Other layers 620 may be grown over the germanium layer 622. In another implementation, multiple repetitions of the porous germanium sublayer 624 and the germanium sublayer 640 may be used to achieve a desired level of lattice constant in layered structure 618. The germanium sublayer 622 may be grown on top of the multiple repetitions of the porous germanium sublayer 624 and the germanium sublayer 640. The upper surface of bulk germanium wafer 636, which is also the upper surface of germanium sublayer 622, has a lattice constant that is substantially equivalent to a bulk germanium substrate (without porous portion).

Layered structure 626 depicts a substrate structure 638 that includes a germanium layer 630 and a silicon layer 632, where the germanium layer 630 is grown over the silicon layer 632. The upper surface of the germanium wafer 630 has a lattice constant that is substantially equivalent to a bulk germanium substrate.

In some embodiments, the lattice constants of substrates 634, 636, and 638 are approximately equal to the lattice constant of germanium 606 in layered structure 602. In some embodiments, germanium 606 may be replaced by any of substrates 634, 636, and 638.

In some embodiments, the germanium substrate 606 may include a patterned germanium wafer. For example, the germanium wafer has spatially non-overlapping germanium portions, e.g., stripes, grids, and/or the like. The lattice constant of the upper surface of the patterned germanium wafer is equivalent to a bulk germanium substrate.

In some embodiments, the germanium substrate 606 can include a germanium tin ($Ge_xSn_{1-x}$, $0 \leq x \leq 1$) wafer that is grown over a germanium wafer.

In some embodiments, an additional epitaxial germanium layer is grown over the germanium substrate. The epitaxial germanium layer can be used to host an embedded device, and wherein the embedded device is selected from a group consisted of a germanium APD, a GaAs PIN and a Germanium transistor.

Figure 7:
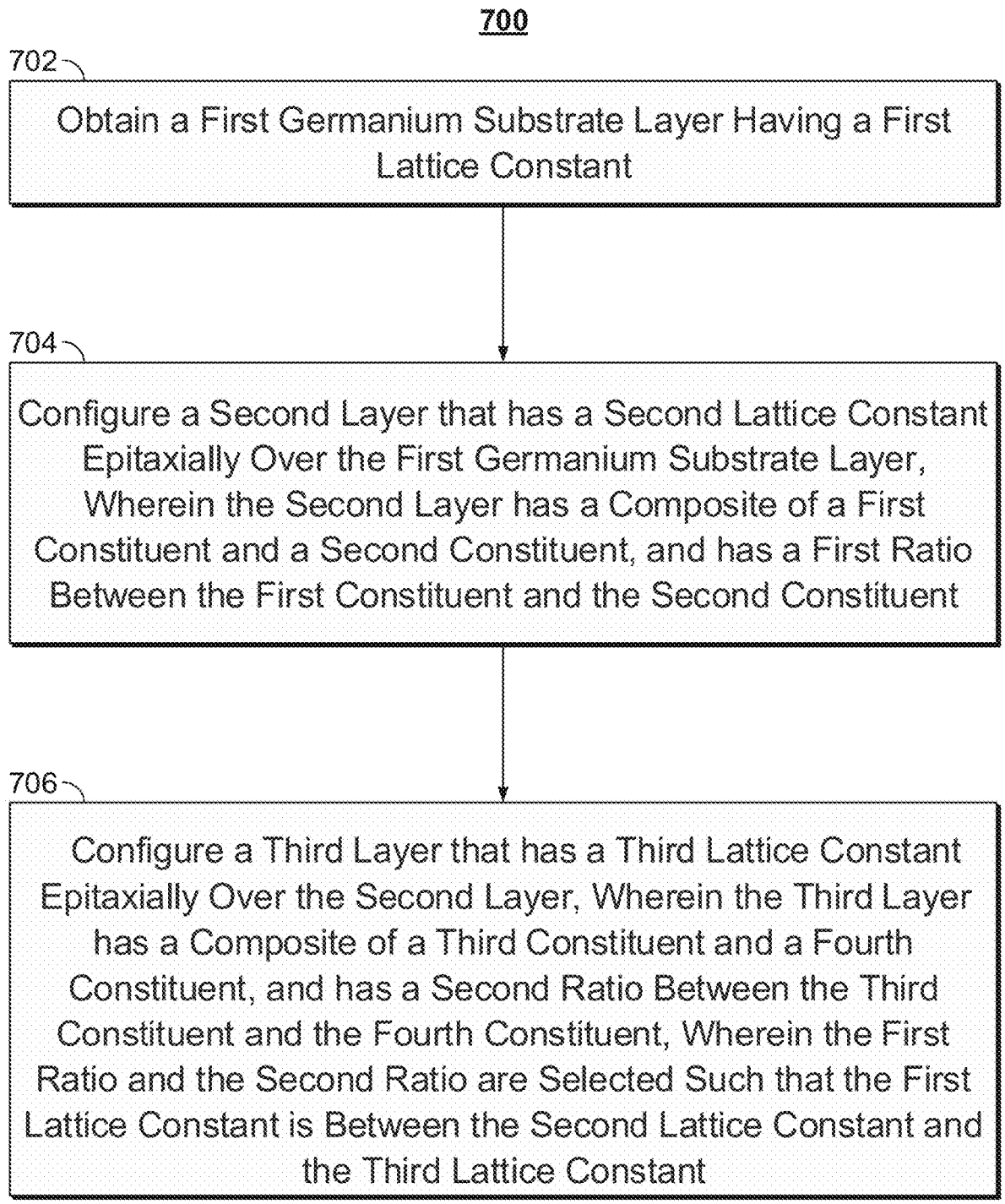
FIG. 7 is flow chart of a process 700 growing layered structure 100, according to an illustrative embodiment.

FIG. 7 is flow chart of a process 700 growing layered structure 100, according to an illustrative embodiment. The process starts at 702, when a first germanium substrate (e.g., the germanium substrate 102 of FIG. 1) having a first lattice constant is obtained.

At 704, a second layer 104 (e.g., the GaAs/AlAs layer 104) that has a second lattice constant is configured over the first germanium substrate layer 102. The second layer has a composite of a first constituent (e.g., GaAs) and a second constituent (e.g., AlAs) and has a first ratio between the first constituent and the second constituent. For example, to "configure" means to grow (epitaxially) or to dispose, or by any other means to make an additional layer exist on top of a layer. In some embodiments, the first or the second constituent may be a III-V binary alloy, such as but not limited to AlP, GaP, InP, AlAs, GaAs, InAs, AlSb, GaSb, and InSb.

At 706, a third layer (e.g., any additional layer 106 in FIG. 1) that has a third lattice constant is configured (e.g., epitaxially grown or disposed) over the second layer. The third layer has a composite of a third constituent and a fourth constituent, and has a second ratio between the third constituent and the fourth constituent. In some embodiments, the third or the fourth constituent may be a III-V binary alloy, such as but not limited to AlP, GaP, InP, AlAs, GaAs, InAs, AlSb, GaSb, and InSb. The first ratio and the second ratio are selected such that the first lattice constant is between the second lattice constant and the third lattice constant. In this way, the strain caused by the lattice mismatch between the first germanium substrate and the second layer can be offset by the lattice mismatch (in an opposite direction) between the second layer and the third layer. Specifically, the thickness of the second layer and the thickness of the third layer are chosen such that a total strain in the layered structured that is defined at least in part by the thickness of the layers and lattice constant differences between adjacent layers is close to zero.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially-uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk germanium wafers, bulk silicon wafers, in which a wafer comprises a homogeneous thickness of single-crystal silicon or germanium; composite wafers, such as a silicon-on-insulator wafer that comprises a layer of silicon that is disposed on a layer of silicon dioxide that is disposed on a bulk silicon handle wafer; or the porous germanium, germanium over oxide and silicon, germanium over silicon, patterned germanium, germanium tin over germanium, and/or the like, as described in relation to FIG. 6; or any other material that serves as base layer upon which, or in which, devices are formed. Examples of such other materials that are suitable, as a function of the application, for use as substrate layers and bulk substrates include, without limitation, alumina, gallium-arsenide, indium-phosphide, silica, silicon dioxide, borosilicate glass, pyrex, and sapphire. A substrate may have a single bulk wafer, or multiple sublayers. Specifically, a substrate (e.g., silicon, germanium, etc.) may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions between prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions include, without limitation: silicon-on-insulator, germanium-on-insulator, and silicon-germanium-on-insulator.

A first layer described and/or depicted herein as "configured on," "on" or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A layered structure, comprising:
   a first germanium substrate layer having a first lattice constant and a first thickness; and
   a second layer that has a second lattice constant, a second thickness and is epitaxially grown over the first germanium substrate layer, wherein the second layer is a composite of a first constituent and a second constituent, and has a first ratio of the first constituent to the second constituent;
   a third layer that has a third lattice constant, a third thickness and is epitaxially grown over the second layer, wherein the third layer is a composite of a third constituent and a fourth constituent and has a second ratio of the third constituent to the fourth constituent, wherein:
   the first ratio and the second ratio are selected such that the first lattice constant is between the second lattice constant and the third lattice constant,
   the second thickness and the third thickness are chosen such that a total strain in the layered structure is close to zero with respect to the substrate, as is defined at least in part by:
   a) the second thickness;
   b) the third thickness; and
   c) lattice constant differences between the adjacent layers;
   a first lattice mismatch between the first germanium substrate layer and the adjacent second layer is offset by a second lattice mismatch between the first germanium substrate layer and the third layer to thereby reduce the total strain on the layered structure, and
   the layered structure has a single in-plane lattice spacing.

2. The layered structure of claim 1, wherein the first constituent is the same as the third constituent, and the second constituent is the same as the fourth constituent.

3. The layered structure of claim 1, wherein the first constituent is different from the third constituent.

4. The layered structure of claim 1, wherein the first, the second, the third or the fourth constituent is a III-V binary alloy selected from a group consisting of AlP, GaP, InP, AlAs, GaAs, InAs, AlSb, GaSb, and InSb.

5. The layered structure of claim 1, further comprising:
   a repetition of the second layer and the third layer grown over the third layer.

6. The layered structure of claim 1, wherein the layered structure is implemented as a vertical-cavity surface-emitting laser (VCSEL) epitaxial wafer.

7. The layered structure of claim 6, wherein the VCSEL epitaxial wafer has a bow measurement less than 10 μm.

8. The layered structure of claim 1, wherein the first germanium substrate layer is a single germanium wafer, and a lattice constant of an upper surface of the single germanium wafer is equivalent to a bulk germanium substrate.

9. The layered structure of claim 1, wherein the first germanium substrate layer includes a germanium wafer on an oxide layer that is on a silicon layer, and
wherein a lattice constant of an upper surface of the germanium wafer is equivalent to a bulk germanium substrate.

10. The layered structure of claim 1, wherein the first germanium substrate layer includes a germanium wafer on a silicon layer, and
wherein a lattice constant of an upper surface of the germanium wafer is equivalent to a bulk germanium substrate.

11. The layered structure of claim 1, wherein the first germanium substrate layer includes one or more porous germanium sublayers between two germanium sublayers, and
wherein a lattice constant of an upper surface of the first germanium substrate layer that is adjacent to the second layer is equivalent to a lattice constant of a bulk germanium substrate.

12. The layered structure of claim 1, wherein the first germanium substrate layer includes a patterned germanium wafer having a first germanium portion and a second germanium portion that is spatially non-overlapping from the first germanium portion, and
wherein a lattice constant of an upper surface of the first region or the second region in the patterned germanium wafer is equivalent to a bulk germanium substrate.

13. The layered structure of claim 1, wherein the first germanium substrate layer includes a layered structure of a germanium tin ($Ge_xSn_{1-x}$, $0 \leq x \leq 1$) wafer that is grown over a germanium wafer.

14. The layered structure of claim 1, further comprising:
an epitaxial germanium layer grown over the first germanium substrate layer, wherein the epitaxial germanium layer is used to host an embedded device, and wherein the embedded device is selected from a group consisted of a germanium APD, a GaAs PIN and a germanium transistor.

15. The layered structure of claim 1, further comprising:
a second germanium layer, having the first lattice constant, that is directly or indirectly above the third layer; and
a fourth layer having the first constituent and the second constituent epitaxially grown over the second germanium layer; wherein:
a third ratio between the first constituent and the second constituent in the fourth layer is chosen to render a third lattice constant of the fourth layer that is used to offset a total strain from layers below the second germanium layer.

16. The layered structure of claim 1, wherein the layered structure has a bow measurement less than 10 μm.

17. The layered structure of claim 1, wherein the first germanium substrate layer eliminates slip line.

18. A method to grow a layered structure, comprising:
obtaining a first germanium substrate layer having a first lattice constant and a first thickness; and
configuring a second layer that has a second lattice constant, a second thickness and is epitaxially grown over the first germanium substrate layer, wherein the second layer is a composite of a first constituent and a second constituent, and has a first ratio of the first constituent to the second constituent;
configuring a third layer that has a third lattice constant, a third thickness and is epitaxially grown over the second layer, wherein the third layer is a composite of a third constituent and a fourth constituent, and has a second ratio of the third constituent to the fourth constituent;
wherein:
the first ratio and the second ratio are selected such that the first lattice constant is between the second lattice constant and the third lattice constant,
the second thickness and the third thickness are chosen such that a total strain in the layered structure is close to zero with respect to the substrate, as is defined at least in part by:
a) the second thickness;
b) the third thickness; and
c) lattice constant differences between the adjacent layers;
a first lattice mismatch between the first germanium substrate layer and the second layer is offset by a second lattice mismatch between the first germanium substrate layer and the third layer to thereby reduce the total strain on the layered structure; and
the layered structure has a single in-plane lattice spacing.

19. The method of claim 18, further comprising:
configuring a second germanium layer, having the first lattice constant, that is directly or indirectly above the third layer; and
configuring a fourth layer having the first constituent and the second constituent epitaxially grown over the second germanium layer; wherein:
a third ratio between the first constituent and the second constituent in the fourth layer is chosen to render a third lattice constant of the fourth layer that is used to offset a total strain from layers below the second germanium layer.

20. The method of claim 18, wherein:
the first germanium substrate layer includes a patterned germanium wafer having a first germanium portion and a second germanium portion that is spatially non-overlapping from the first germanium portion; and
a lattice constant of an upper surface of the first region or the second region in the patterned germanium wafer is equivalent to a bulk germanium substrate.

* * * * *

UNITED STATES PATENT AND TRADEMARK OFFICE
CERTIFICATE OF CORRECTION

PATENT NO. : 11,005,231 B2
APPLICATION NO. : 16/198391
DATED : May 11, 2021
INVENTOR(S) : Clark et al.

Page 1 of 1

It is certified that error appears in the above-identified patent and that said Letters Patent is hereby corrected as shown below:

On the Title Page

Item (73), in "Assignee", Line 1, delete "pic," and replace with --plc--.

In the Claims

In Column 10, Claim 4, Line 63, delete "AIP," and replace with --AlP--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*